US010644711B1

(12) United States Patent
Tseng

(10) Patent No.: US 10,644,711 B1
(45) Date of Patent: May 5, 2020

(54) SELF-BIASED DIGITALLY CONTROLLED OSCILLATOR ARCHITECTURE

(71) Applicant: QUALCOMM Incorporated, San Diego, CA (US)

(72) Inventor: Yi-Hung Tseng, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/225,270

(22) Filed: Dec. 19, 2018

(51) Int. Cl.
*H03L 7/099* (2006.01)
*H03L 7/093* (2006.01)
*H03L 7/18* (2006.01)

(52) U.S. Cl.
CPC ............ *H03L 7/0991* (2013.01); *H03L 7/093* (2013.01); *H03L 7/18* (2013.01); *H03L 2207/50* (2013.01)

(58) Field of Classification Search
CPC ......... H03L 7/0991; H03L 7/093; H03L 7/18; H03L 2207/50

USPC ......................................................... 375/376
See application file for complete search history.

(56) References Cited

U.S. PATENT DOCUMENTS 9,876,979 B1* 1/2018 Chang .................... H03B 5/366
2018/0152177 A1* 5/2018 Yang ...................... H03K 3/011

* cited by examiner

*Primary Examiner* — Kevin M Burd
(74) *Attorney, Agent, or Firm* — Patterson & Sheridan, L.L.P.

(57) ABSTRACT

Certain aspects of the present disclosure are directed to a digitally controlled oscillator (DCO). The DCO generally includes an oscillator, a current mirror having a first branch coupled to a control input of the oscillator, a first current source, and a first transistor having a drain coupled to the first current source and a gate of the first transistor, a source of the first transistor being coupled to the control input of the oscillator. The DCO may also include a second current source coupled to the source of the first transistor, and a second transistor having a gate coupled to the gate of the first transistor, a drain of the second transistor being coupled to a second branch of the current mirror.

20 Claims, 5 Drawing Sheets

SELF-BIASED DIGITALLY CONTROLLED OSCILLATOR ARCHITECTURE

TECHNICAL FIELD

Certain aspects of the present disclosure generally relate to electronic circuits and, more particularly, to a digitally controlled oscillator (DCO).

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry. The RF front-end circuitry may include one or more phase-locked loops (PLLs) for generating local oscillator (LO) signals to be used for upconversion of baseband and/or intermediate frequency (IF) signals and downconversion of RF signals.

SUMMARY

Certain aspects of the present disclosure are directed to a digitally controlled oscillator (DCO). The DCO generally includes an oscillator, a current mirror having a first branch coupled to a control input of the oscillator, a first current source, and a first transistor having a drain coupled to the first current source and a gate of the first transistor, a source of the first transistor being coupled to the control input of the oscillator. The DCO may also include a second current source coupled to the source of the first transistor, and a second transistor having a gate coupled to the gate of the first transistor, a drain of the second transistor being coupled to a second branch of the current mirror.

Certain aspects of the present disclosure are directed to a method for controlling an oscillator. The method generally includes controlling the oscillator by generating a control current provided to a control input of the oscillator, voltage dividing a control voltage at the control input to generate a voltage-divided control voltage, generating a reference voltage based on the voltage-divided control voltage, and generating a first reference current based on the reference voltage, wherein the control current is proportional to the first reference current in accordance with a current mirror ratio set by a digital control word.

Certain aspects of the present disclosure are directed to an apparatus for controlling an oscillator. The apparatus generally includes means for controlling the oscillator by generating a control current provided to a control input of the oscillator, means for voltage dividing a control voltage at the control input to generate a voltage-divided control voltage, and means for generating a reference voltage based on the voltage-divided control voltage, wherein a first reference current is generated based on the reference voltage, the control current being proportional to the first reference current.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
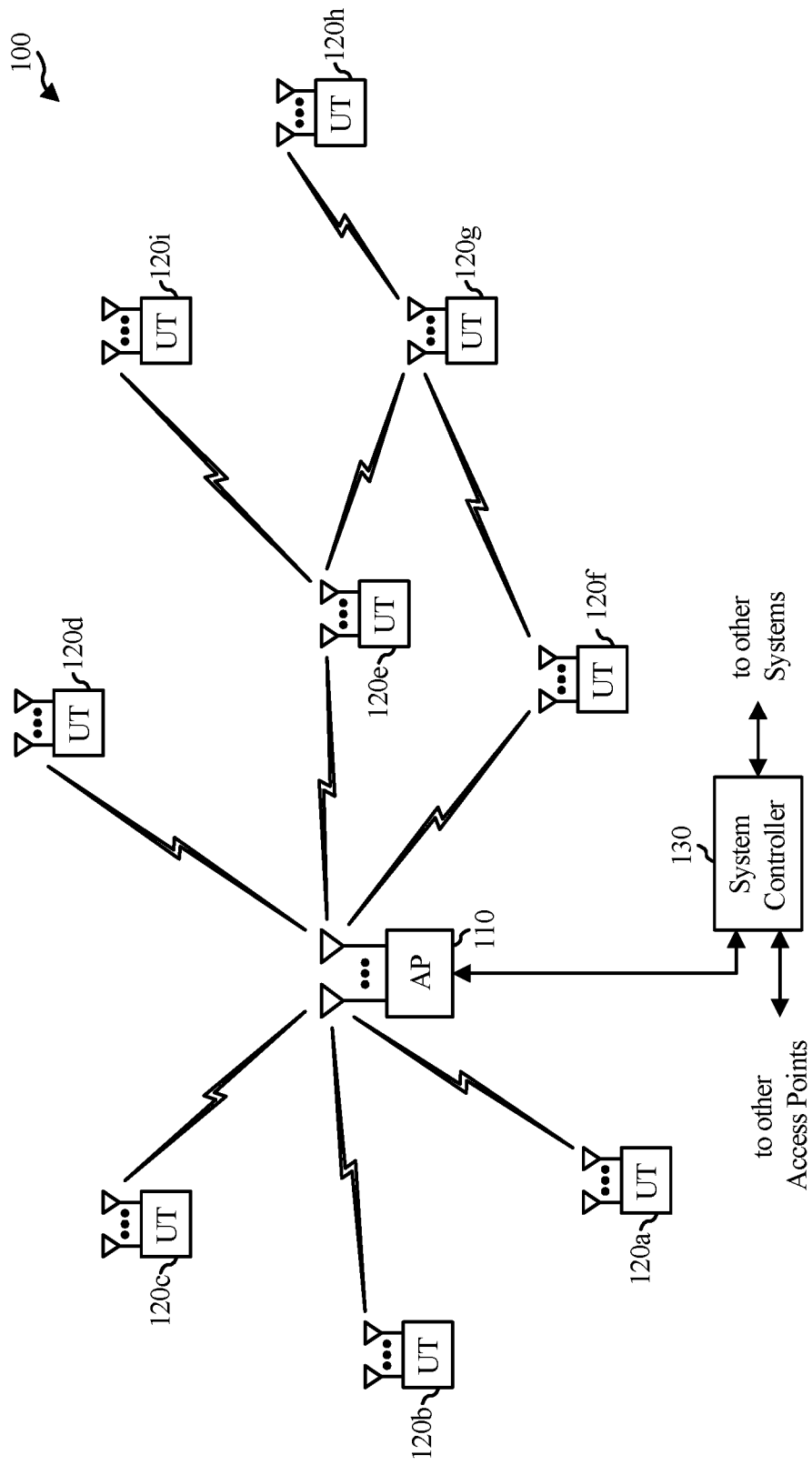
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a phase-locked loop (PLL) which may be implemented using a digitally controlled oscillator (DCO), as described in more detail herein.

Figure 2:
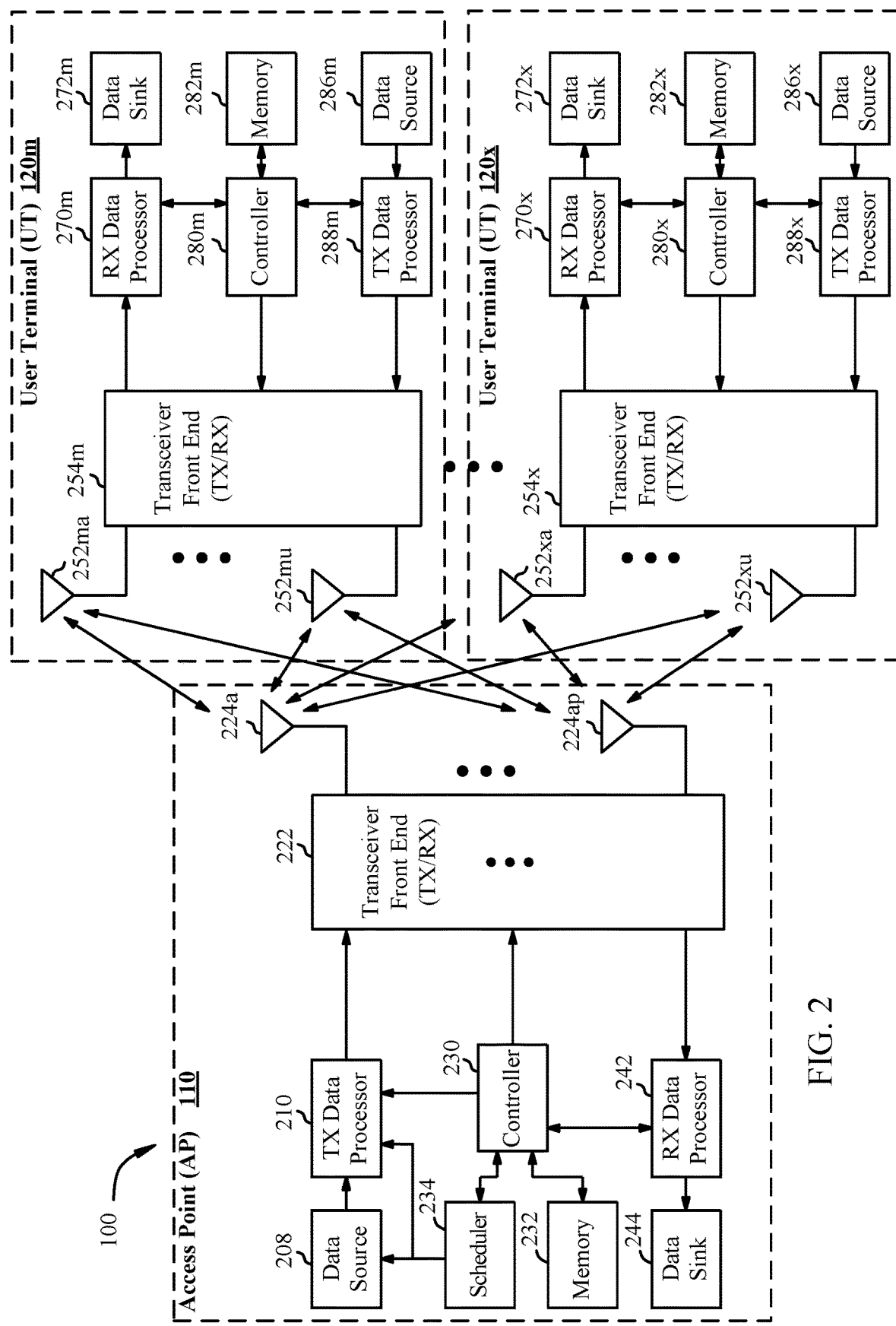
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a phase-locked loop (PLL) implemented using a DCO, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the N antennas 224 for transmit diversity via an RF switch, for example. The controller 230 may control the routing within the transceiver front end 222.

Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
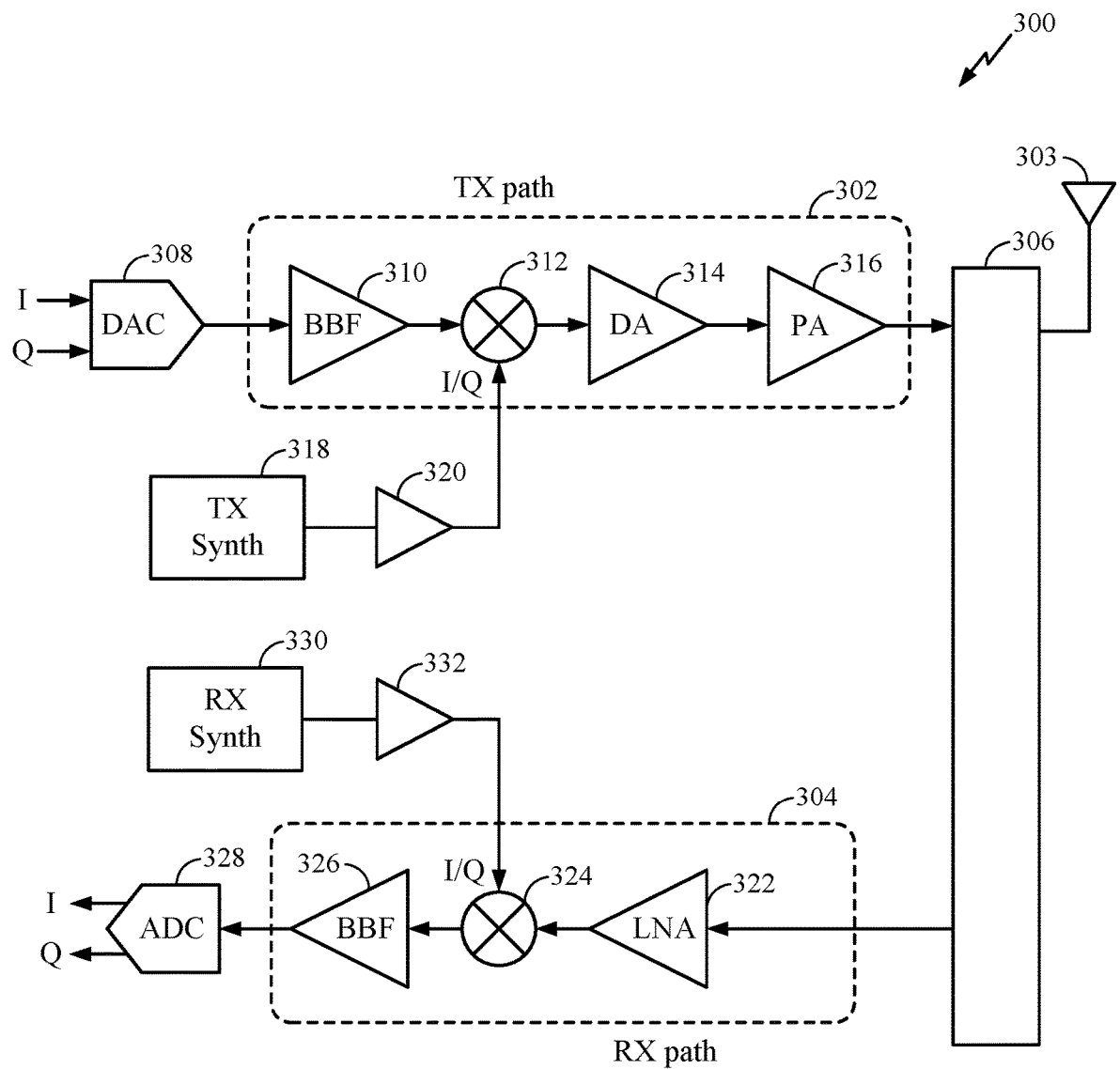
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects of the present disclosure, the TX frequency synthesizer 318 and/or RX frequency synthesizer 330 may be implemented with a phase-locked loop (PLL) implemented using a DCO, as described in more detail herein.

Example Self-Biased Digitally Controlled Oscillator Architecture

A digitally controlled oscillator (DCO) is an important block in a digital phase-locked loop (PLL)/frequency-locked loop (FLL). The DCO receives a digital frequency control word (fcw) and generates a signal having a frequency set by the fcw. It may be advantageous for the DCO to cover the entire operating range of the PLL across process, voltage, and temperature (PVT).

To cover the entire operating range across PVT, it may be desirable to have a linear frequency response to reduce the size and simplify the design of a digital-to-analog converter (DAC) used in the DCO. One technique for achieving a linear frequency response is to implement the DCO using an error amplifier. However, using an error amplifier may involve employing an independent bias (e.g., a bandgap reference) in order to bias the error amplifier. The error amplifier and the circuitry for generating the bandgap reference consume significant direct-current (DC) power and take up a large area, increasing the baseline power consumption of the system on chip (SOC) in idle/standby states, as well as reducing the days of usage (DoU) of the SOC (e.g., DoU of a cell phone), which is especially problematic for low frequency/power use applications.

Certain aspects of the present disclosure are directed to a DCO that may be implemented without an error amplifier or a bandgap reference, while achieving frequency linearity. Certain aspects provide power savings as compared to conventional DCO implementations, especially in low-power SOC applications. Moreover, certain aspects of the present disclosure reduce the baseline SOC power and increase the DoU of the SoC, while reducing the area consumption of the DCO.

Figure 4:
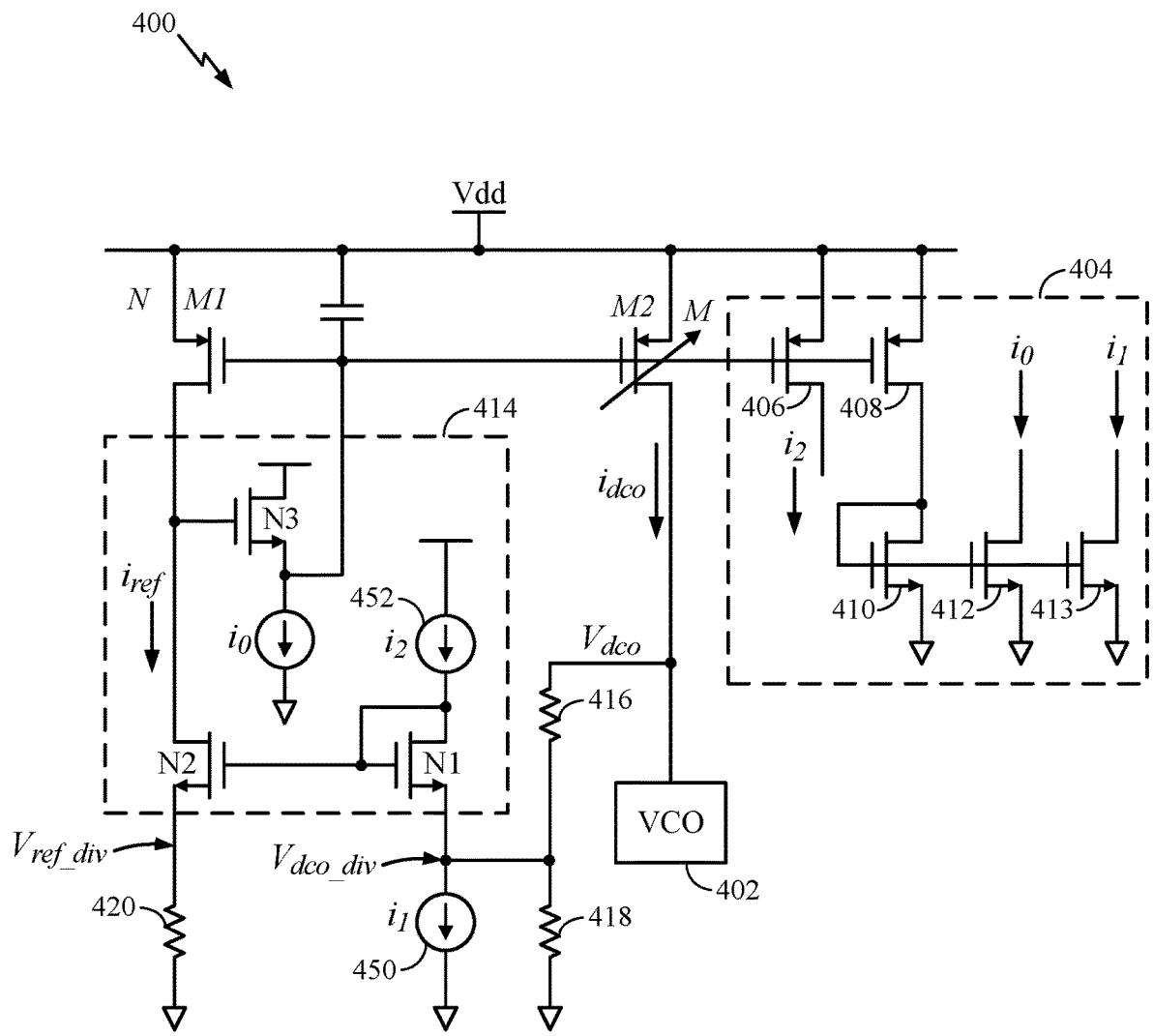
FIG. 4 illustrates an example digitally controlled oscillator (DCO), in accordance with certain aspects of the present disclosure.

FIG. 4 illustrates an example DCO 400, in accordance with certain aspects of the present disclosure. As illustrated, the DCO 400 includes one or more transistors M1 and transistors M2 and a voltage-controlled oscillator (VCO) 402. A digital codeword may be used to selectively incorporate each of the transistors M2 into a current mirror formed by transistors M1 and M2. The total number of transistor(s) M1 is represented by variable N, and the total number of transistors M2 incorporated into the current mirror is represented by the variable M, where M is adjusted according to the digital codeword. The ratio of M to N sets the control current $i_{dco}$ sourced to the VCO 402, as described in more detail herein.

The DCO 400 also includes current mirror circuitry 404 used to generate reference currents $i_0$, $i_1$, and $i_2$ based on the control current $i_{dco}$. The current mirror circuitry 404 includes transistors 406, 408, 410, 412, 413. The transistor 406 forms another branch of the current mirror with transistors M1 and M2 to generate the reference current $i_2$. The transistor 408 forms yet another branch of the current mirror with transistors M1 and M2. The transistor 408 is coupled to another current mirror formed by transistors 410, 412, 413 for generating reference currents $i_0$ and $i_1$, as illustrated. The reference currents $i_0$, $i_1$, $i_2$ are used for generating the current $i_{dco}$ by the circuitry 414, as described in more detail herein.

The control voltage $V_{dco}$ of the VCO 402 is input to a voltage divider circuit formed by resistive elements 416, 418. The resistive element 418 is coupled between a tap node of the voltage divider and a reference potential node (e.g., electrical ground). A voltage-divided version of $V_{dco}$ ($V_{dco\_di}$) is generated at the tap node between the resistive elements 416, 418 at the source of transistor N1. The reference current $i_1$ (e.g., represented by current source 450) is sunk by transistor 413 from the source of transistor N1 to the reference potential node (e.g., electrical ground), and the reference current $i_2$ (e.g., represented by current source 452) is sourced by transistor 406 to the drain of transistor N1. If the reference currents $i_1$, $i_2$ are about the same, the voltage at the gates of transistors N1 and N2 may be equal to $V_{dco\_div}$ plus the gate-to-source voltage ($V_{gs}$) of transistor N1. If the gate-to-source voltages of transistors N1 and N2 are configured to match, then the voltage $V_{ref\_div}$ may be about equal to the voltage-divided control voltage $V_{dco\_div}$. The current $i_{ref}$ may be equal to the voltage $V_{ref\_div}$ divided by the resistance of the resistive element 420, which is coupled between the transistor N2 and the reference potential node (e.g., electrical ground). The resistance of the resistive element 420 may be equal to the resistance of the resistive element 418.

The transistor N3 and current source $i_0$ form a level shifter circuit. In other words, instead of shorting the gate(s) of transistor(s) M1 with the drain(s) of transistor(s) M1 to form a traditional current mirror with transistors M1 and M2, the level shifter circuit (e.g., transistor N3) is implemented between the gate(s) and drain(s) of transistor(s) M1 to reduce the headroom for keeping transistor M1 in the saturation region. In other words, the gate voltage of transistor N3 tracks the source voltage of transistor N3, but shifted to a higher voltage, allowing the current mirror formed by transistors M1 and M2 to operate with a lower supply voltage Vdd.

The DCO 400 is implemented with a self-biased design without using a bandgap reference or an error amplifier, while also achieving frequency linearity. The DCO 400 is less complex as compared to conventional DCOs implemented using an error amplifier, while achieving similar performance. The DCO 400 may be used in a wide range of PLL applications, and is particularly suitable for low cost general-purpose PLLs, which are found in a variety of subsystems on SOCs.

Figure 5:
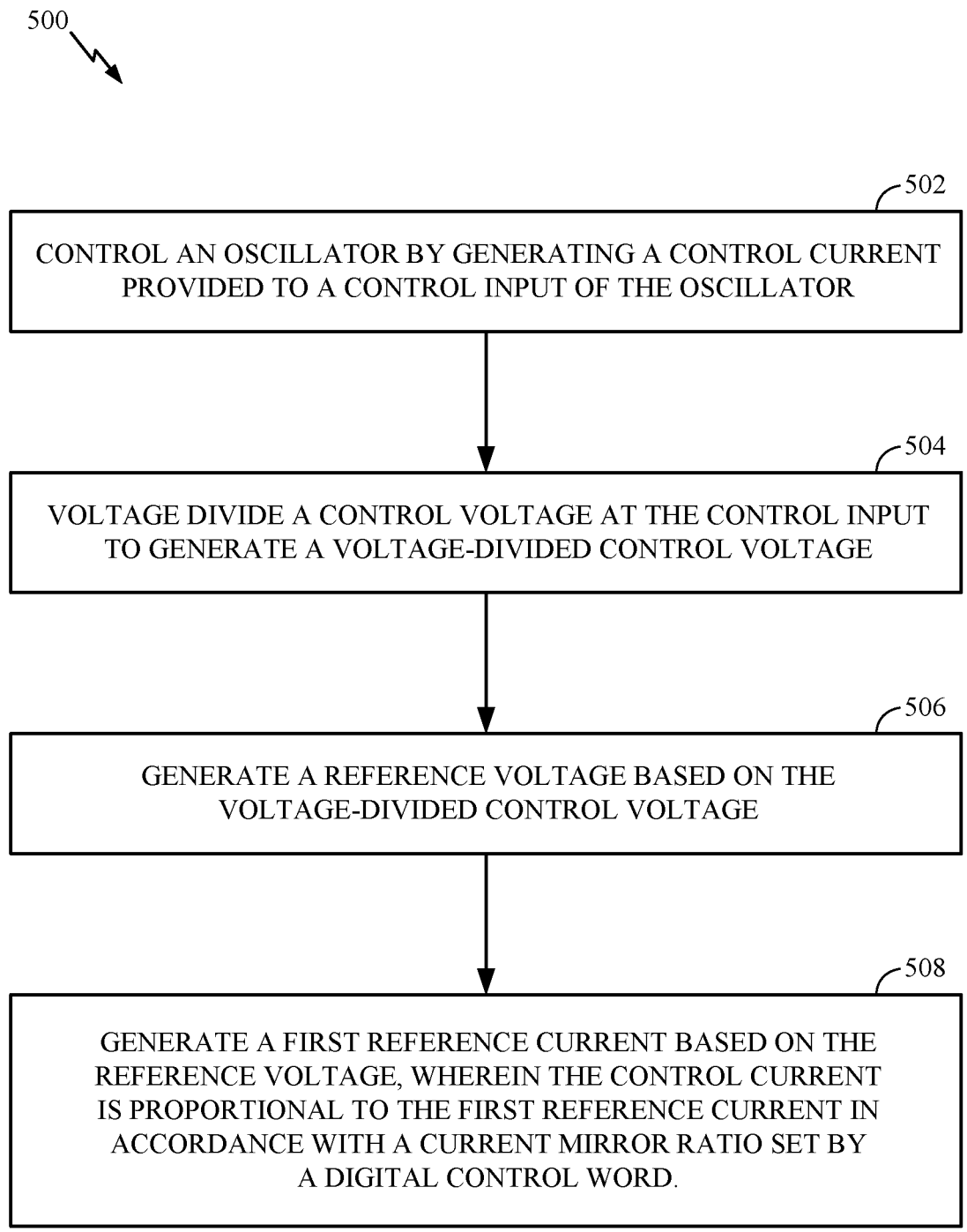
FIG. 5 is a flow diagram of example operations for controlling an oscillator, in accordance with certain aspects of the present disclosure.

FIG. 5 is a flow diagram of example operations 500 for controlling an oscillator (e.g., VCO 402), in accordance with certain aspects of the present disclosure. The operations 500 may be performed by a circuit, such as the DCO 400.

The operations 500 begin, at block 502, by controlling the oscillator by generating a control current (e.g., $i_{dco}$) provided to a control input of the oscillator, and at block 504, by voltage dividing a control voltage (e.g., $V_{dco}$) at the control input to generate a voltage-divided control voltage (e.g., $V_{dco\_div}$). At block 506, the circuit generates a reference voltage (e.g., $V_{ref\_div}$) based on the voltage-divided control voltage, and at block 508, generates a first reference current (e.g., $i_{ref}$) based on the reference voltage. In certain aspects, the control current may be proportional to the first reference current in accordance with a current mirror ratio (e.g., the ratio of M to N as described herein) set by a digital control word.

In certain aspects, generating the reference voltage involves sourcing (e.g., via transistor 406) a second reference current (e.g., reference current $i_2$) to a drain of a first transistor (e.g., transistor N1), the drain of the first transistor being coupled to a gate of the first transistor. In certain aspects, the gate of the first transistor is coupled to a gate of a second transistor (e.g., transistor N2). The operations 500 may also include sinking (e.g., via transistor 413) a third reference current (e.g., reference current $i_1$) from a source of the first transistor. The reference voltage may be generated at a source of the second transistor (e.g., transistor N2). In certain aspects, the second reference current and the third reference current are generated based on the control current. In certain aspects, the first reference current is sunk via the second transistor from a first branch of a current mirror (e.g., current mirror formed by transistors M1 and M2) having the current mirror ratio, the control current being generated at a second branch of the current mirror.

In certain aspects, the operations 500 also include controlling (e.g., via the level shifter circuit having transistor N3) a gate voltage of transistors of the current mirror based on a voltage at a drain of the second transistor. In certain aspects, the gate voltage may be proportional to the voltage at the drain of the second transistor. In certain aspects, controlling the gate voltage comprises sinking (e.g., via a transistor 412) a fourth reference current (e.g., reference current $i_0$) from a source of a third transistor (e.g., transistor N3) having a gate coupled to the drain of the second transistor (e.g., transistor N2), the source of the third transistor being coupled to the gates of the transistors of the current mirror (e.g., current mirror formed by transistors M1 and M2).

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for controlling may include a current mirror, such as the current mirror formed by transistors M1 and M2. Means for voltage dividing may include a voltage divider, such as the voltage divider formed by resistive elements 416, 418. Means for generating a reference voltage may include a transistor such as the transistors N1 and N2. Means for sourcing or sinking a reference current may include a branch of a current mirror, such as one of the branches formed by transistors 406, 412, and 413.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A digitally controlled oscillator (DCO), comprising:
   an oscillator;
   a current mirror having a first branch coupled to a control input of the oscillator;
   a first current source;
   a first transistor having a drain coupled to the first current source and a gate of the first transistor, a source of the first transistor being coupled to the control input of the oscillator;
   a second current source coupled to the source of the first transistor; and
   a second transistor having a gate coupled to the gate of the first transistor, a drain of the second transistor being coupled to a second branch of the current mirror.

2. The DCO of claim 1, further comprising a voltage divider having a first resistive element and a second resistive element, wherein:
   the first resistive element is coupled between the control input and the second resistive element; and
   a tap node of the voltage divider between the first resistive element and the second resistive element is coupled to the source of the first transistor.

3. The DCO of claim 1, wherein the current mirror comprises one or more third transistors and one or more fourth transistors, wherein gates of the one or more third transistors are coupled to gates of the one or more fourth transistors, and wherein sources of the one or more third transistors are coupled to sources of the one or more fourth transistors.

4. The DCO of claim 3, wherein a quantity of the one or more fourth transistors configured for use in the current mirror is controlled by a digital control word.

5. The DCO of claim 3, further comprising:
   a level shifter circuit coupled between the gates of the one or more third transistors and drains of the one or more third transistors.

6. The DCO of claim 5, wherein the level shifter circuit comprises:
   a fifth transistor having a gate coupled to the drains of the one or more third transistors; and
   a third current source coupled to a source of the fifth transistor, the source of the fifth transistor being coupled to the gates of the one or more third transistors.

7. The DCO of claim 6, wherein the third current source composes a portion of another current mirror having:
   a first branch coupled to a third branch of the current mirror; and
   a second branch coupled to the source of the fifth transistor and comprising the third current source.

8. The DCO of claim 3, further comprising a capacitive element coupled between the gates of the one or more third transistors and the sources of the one or more fourth transistors.

9. The DCO of claim 1, wherein the first current source composes a portion of a third branch of the current mirror.

10. The DCO of claim 1, wherein the second current source composes a portion of another current mirror having:
    a first branch coupled to a third branch of the current mirror; and
    a second branch coupled to the source of the first transistor and comprising the second current source.

11. A method for controlling an oscillator, comprising:
    controlling the oscillator by generating a control current provided to a control input of the oscillator;
    voltage dividing a control voltage at the control input to generate a voltage-divided control voltage;
    generating a reference voltage based on the voltage-divided control voltage; and
    generating a first reference current based on the reference voltage, wherein the control current is proportional to the first reference current in accordance with a current mirror ratio set by a digital control word.

12. The method of claim 11, wherein generating the reference voltage comprises:
    sourcing a second reference current to a drain of a first transistor, the drain of the first transistor being coupled to a gate of the first transistor, wherein the gate of the first transistor is coupled to a gate of a second transistor; and
    sinking a third reference current from a source of the first transistor, wherein the reference voltage is generated at a source of the second transistor.

13. The method of claim 12, wherein the second reference current and the third reference current are generated based on the control current.

14. The method of claim 12, wherein the first reference current is sunk via the second transistor from a first branch of a current mirror having the current mirror ratio, the control current being generated at a second branch of the current mirror.

15. The method of claim 14, further comprising:
    controlling a gate voltage of transistors of the current mirror based on a voltage at a drain of the second transistor.

16. The method of claim 15, wherein the gate voltage is proportional to the voltage at the drain of the second transistor.

17. The method of claim 15, wherein controlling the gate voltage comprises sinking a fourth reference current from a source of a third transistor having a gate coupled to the drain of the second transistor, the source of the third transistor being coupled to the gates of the transistors of the current mirror.

18. An apparatus for controlling an oscillator, comprising:
    means for controlling the oscillator by generating a control current provided to a control input of the oscillator;
    means for voltage dividing a control voltage at the control input to generate a voltage-divided control voltage; and
    means for generating a reference voltage based on the voltage-divided control voltage, wherein a first reference current is generated based on the reference voltage, the control current being proportional to the first reference current.

19. The apparatus of claim 18, wherein the means for generating the reference voltage comprises:

means for sourcing a second reference current to a drain of a first transistor, the drain of the first transistor being coupled to a gate of the first transistor, and wherein the gate of the first transistor is coupled to a gate of a second transistor; and means for sinking a third reference current from a source of the first transistor, wherein the reference voltage is generated at a source of the second transistor.

20. The apparatus of claim 19, wherein the second reference current and the third reference current are generated based on control current.

* * * * *